US010955494B2

(12) United States Patent
Renda et al.

(10) Patent No.: US 10,955,494 B2
(45) Date of Patent: Mar. 23, 2021

(54) MAGNETIC FIELD SENSOR IN A PORTABLE ELECTRONIC DEVICE

(71) Applicant: Apple Inc., Cupertino, CA (US)

(72) Inventors: Nicholas A. Renda, San Francisco, CA (US); Jonathan L. Berk, Mountain View, CA (US); Dylan A. Saracco, Cupertino, CA (US); John C. Difonzo, Emerald Hills, CA (US); Alexander V. Salvatti, Morgan Hill, CA (US); Eric J. Weirshauser, San Jose, CA (US)

(73) Assignee: APPLE INC., Cupertino, CA (US)

( * ) Notice: Subject to any disclaimer, the term of this patent is extended or adjusted under 35 U.S.C. 154(b) by 60 days.

(21) Appl. No.: 16/381,940

(22) Filed: Apr. 11, 2019

(65) Prior Publication Data

US 2020/0096579 A1 Mar. 26, 2020

Related U.S. Application Data

(60) Provisional application No. 62/736,878, filed on Sep. 26, 2018.

(51) Int. Cl.
*G01R 33/09* (2006.01)
*G06F 1/16* (2006.01)

(52) U.S. Cl.
CPC ......... *G01R 33/096* (2013.01); *G01R 33/091* (2013.01); *G06F 1/1677* (2013.01)

(58) Field of Classification Search
CPC ... G01R 33/091; G01R 33/096; G06F 1/1677; G06F 1/1688
USPC ....................................................... 324/252
See application file for complete search history.

(56) References Cited

U.S. PATENT DOCUMENTS

| 7,288,934 | B1 | 10/2007 | Ikarashi et al. | |
| 2010/0238620 | A1 | 9/2010 | Fish | |
| 2012/0212913 | A1* | 8/2012 | Qiu | G06F 1/3287 361/752 |
| 2013/0241545 | A1* | 9/2013 | Obana | G01R 33/18 324/252 |
| 2016/0216741 | A1 | 7/2016 | Farahani et al. | |
| 2016/0275648 | A1* | 9/2016 | Honda | G06F 3/16 |

(Continued)

FOREIGN PATENT DOCUMENTS

| EP | 2672730 A2 | 12/2013 |
| EP | 3144769 A1 | 3/2017 |
| JP | 2010157002 A | 7/2010 |

*Primary Examiner* — Christopher E Mahoney
(74) *Attorney, Agent, or Firm* — Dorsey & Whitney LLP

(57) ABSTRACT

A portable computing device that includes a base portion that carries an audio module and a display housing that carries a display is disclosed. The display housing is coupled with, and rotatable with respect to, the base portion. The display housing includes a magnet, and the base portion includes a magnetic field sensor that detects an external magnetic field of the magnet. The magnetic field sensor provides a signal that deactivates the display. In order to reduce layout changes in the portable computing device, the magnetic field sensor is positioned in an audio housing that carries the audio module. However, the magnetic field sensor is designed and oriented to detect the magnetic field from the magnet in the display housing and effectively ignore magnets associated with the audio module. In order to reduce the amount of electrical connections, the magnetic field sensor is electrically coupled to the audio module.

19 Claims, 7 Drawing Sheets

(56) References Cited

U.S. PATENT DOCUMENTS

| | | |
|---|---|---|
| 2016/0378071 A1 | 12/2016 | Rothkopf |
| 2017/0082461 A1* | 3/2017 | DiFonzo .............. G01R 33/096 |
| 2017/0365234 A1 | 12/2017 | Yamazaki et al. |
| 2017/0373688 A1 | 12/2017 | Kitade |
| 2017/0374472 A1* | 12/2017 | Zhou .................... H04R 29/001 |
| 2018/0314316 A1 | 11/2018 | Xu et al. |

\* cited by examiner

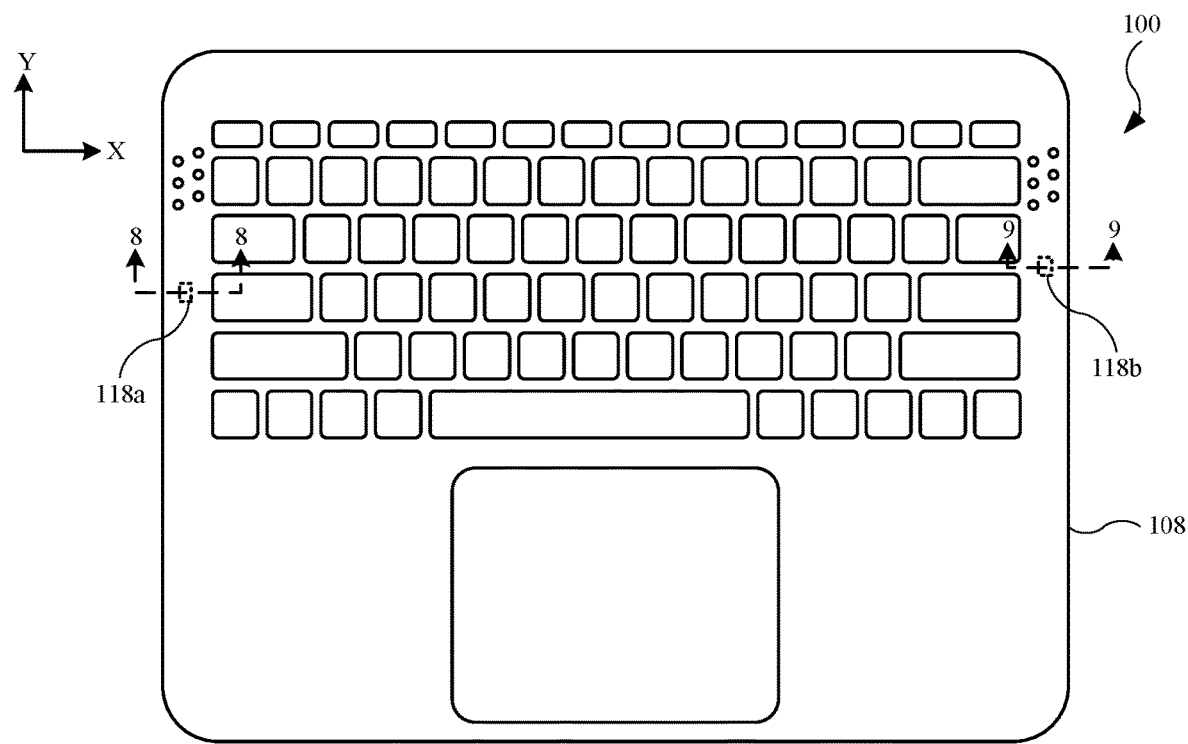
*FIG. 7*
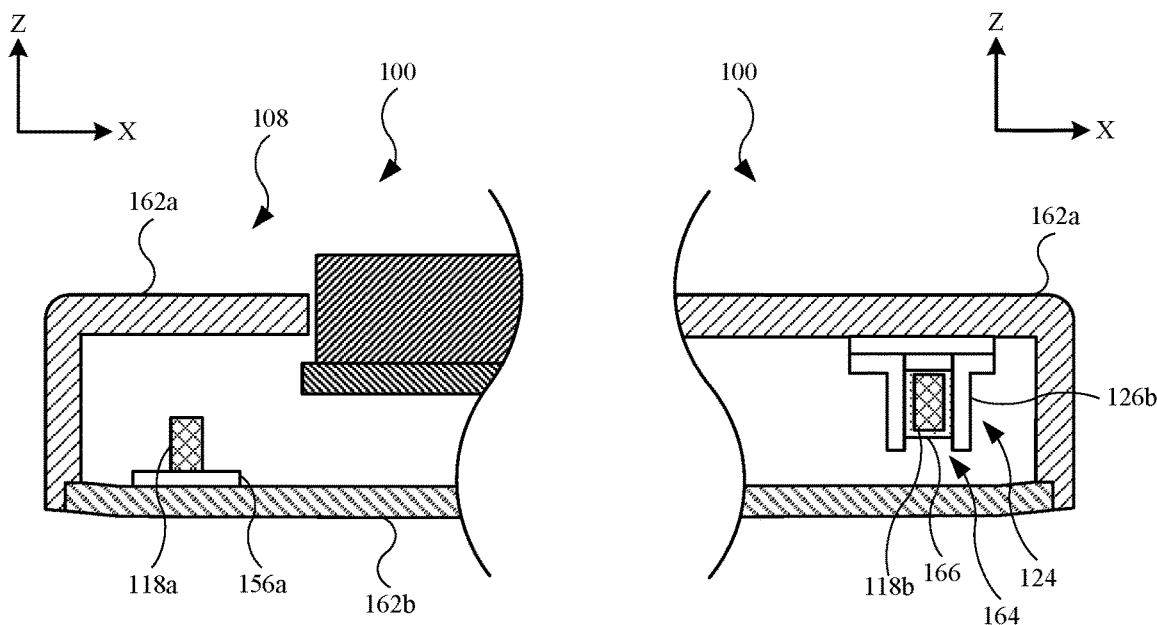
*FIG. 8*  *FIG. 9*

MAGNETIC FIELD SENSOR IN A PORTABLE ELECTRONIC DEVICE

CROSS-REFERENCE TO RELATED APPLICATION(S)

This application claims the benefit of priority to U.S. Provisional Application No. 62/736,878, filed on Sep. 26, 2018, titled "MAGNETIC FIELD SENSOR IN A PORTABLE ELECTRONIC DEVICE," the disclosure of which is incorporated herein by reference in their entirety.

FIELD

The following description relates to portable electronic devices. In particular, the following description relates to magnetic field sensors in portable electronic devices. Magnetic field sensors are used by the portable electronic device to determine whether the portable electronic device is in an open or closed position. Magnetic field sensors can detect a magnetic field along a particular axis or a particular surface (of the magnetic field sensor), while not detecting (or effectively ignoring) magnetic fields along other axes or surfaces. In this regard, magnetic field sensors may include an anisotropic magneto-resistive sensor in which an electrical resistance value varies based upon the location in which the magnetic field is incident on the anisotropic magneto-resistive sensor. Using these types of magnetic field sensors increases the number of locations in which the magnetic field sensor can be placed in a portable electronic device, particularly when a portable electronic device includes several magnets that should not be detected by magnetic field sensors.

BACKGROUND

A portable electronic device, including a laptop device, can include a display that can be rotated relative to a base portion in order to open and close the portable electronic device. In order to conserve battery power, a portable electronic device can shut off the display when the portable electronic device is closed.

SUMMARY

In one aspect, a portable electronic device is described. The portable electronic device may include a display housing that carries a first magnet that emits a first external magnetic field in accordance with a first orientation. The portable electronic device may further include a base portion rotationally coupled to the display housing. The base portion may include a second magnet that emits a second external magnetic field in accordance with a second orientation different from the first orientation. The portable electronic device may further include a magnetic field sensor located in the base portion. In some instances, when the first external magnetic field and the second external magnetic field are incident on the magnetic field sensor, the magnetic field sensor is capable of distinguishing the first external magnetic field from the second external magnetic field.

In another aspect, a portable electronic device is described. The portable electronic device may include a display housing that carries a display. The display housing may further carry a magnet that emits an external magnetic field. The portable electronic device may further include a base portion rotationally coupled to the display housing. The base portion may include an audio assembly that includes an audio module housing. The audio assembly may further include an audio module located in the audio module housing and capable of generating acoustical energy. The audio assembly may further include a magnetic field sensor located in the audio module housing and configured to detect the external magnetic field and provide a signal, when the external magnetic field is detected, that deactivates the display.

In another aspect, a portable electronic device is described. The portable electronic device may include a display housing that carries a display. The display housing may further carry a first magnet that emits a first external magnetic field and a second magnet that emits a second external magnetic field. In some instances, the display is positioned between the first magnet and the second magnet. The portable electronic device may further include a base portion rotationally coupled to the display housing. The base portion may include an audio assembly. The base portion may further include a flexible circuit electrically coupled to the audio assembly. The base portion may further include a first magnetic field sensor configured to detect the first external magnetic field. The first magnetic field sensor can be located within the audio assembly. The base portion may further include a second magnetic field sensor configured to detect the second external magnetic field. The second magnetic field sensor can be located on the flexible circuit.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIG. 7 illustrates a plan view of the electronic device, showing the position of the magnetic field sensors in the base portion;

FIG. 8 illustrates a cross sectional view of the electronic device shown in FIG. 7, taken along line 8-8;

FIG. 9 illustrates a cross sectional view of the electronic device shown in FIG. 7, taken along line 9-9;

Figure 1:
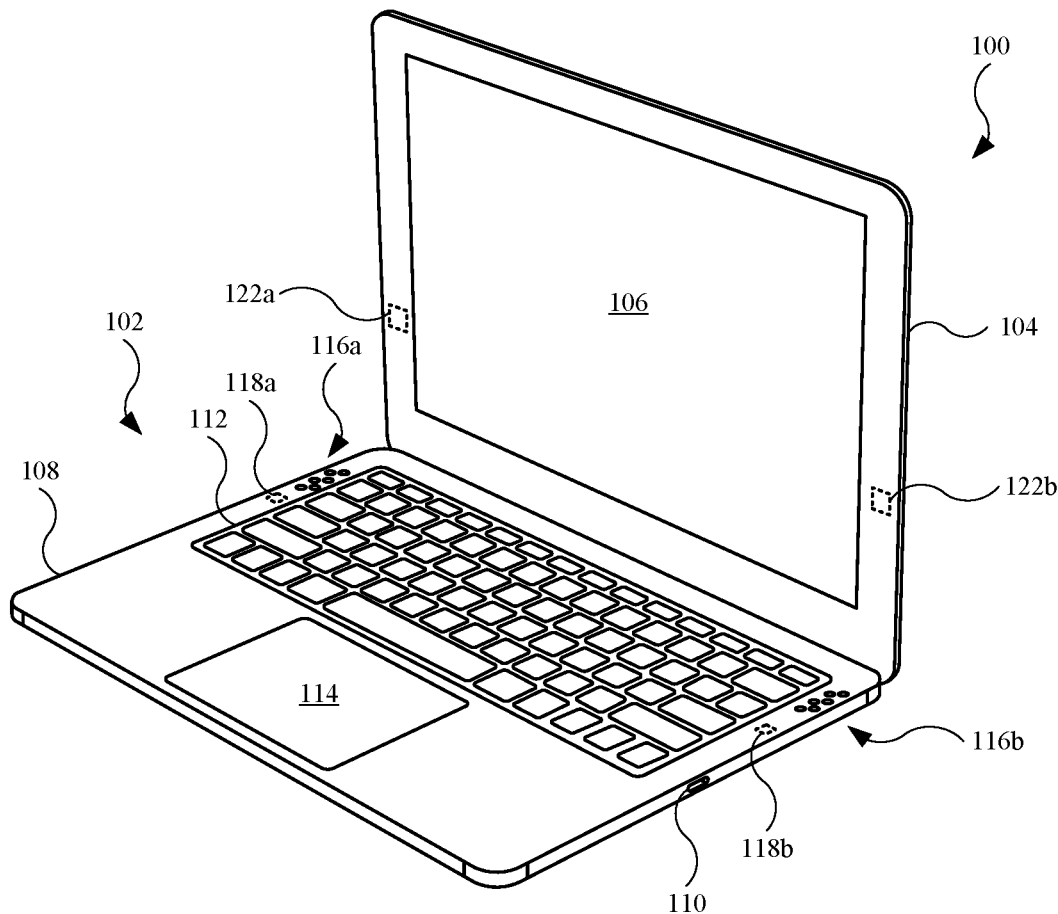
FIG. 1 illustrates an isometric view of an embodiment of an electronic device in an open position, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to portable electronic devices, such as laptop computing devices, that include a display housing rotationally coupled to a base portion. In particular, the following disclosure relates to magnetic field sensors used in portable electronic devices. The display housing carries a display assembly and the base portion carries input devices, such as a keyboard and a touch pad. Magnetic field sensors described herein are used to detect externally-applied magnetic fields. When a magnetic field is detected, the magnetic field sensor initiates and provides a signal, which is used by the portable electronic device to determine whether the portable electronic device is in an open or closed position. The open position is associated with an active mode in which the display assembly and other operational components are active, accessible, and available for use, while the closed position is associated with a sleep mode in which the display assembly and operational components are deactivated, and the portable electronic device is in a transportable configuration.

The activation and deactivation described herein is based upon automated means, as opposed to a user providing a direct command to the portable electronic device. As an example, portable electronic devices may include magnets disposed in the display housing and magnetic field sensors disposed in the base portion. When the display housing is rotated sufficiently close to the base portion, the magnetic field sensors detect magnetic fields from the magnets, and initiate a signal that is provided to a processor of the portable electronic device, with the signal indicating the portable electronic device is at (or approaching) the closed position. Conversely, when the display housing is rotated sufficiently away from the base portion, the magnetic field sensors no longer detect the magnetic fields, and cease to provide the signal, indicating the portable electronic device is in the open position. The display assembly and operational components are subsequently activated in the open position.

Some design constraints in portable electronic devices limit the location of the magnets in the display housing. For example, the display assembly may occupy a significant portion of the display housing, thereby limiting the position of the magnets to a location or space between the edge of the display housing and the display assembly. In order for the magnetic field sensors to detect magnetic fields from these magnets, the magnetic field sensors should be positioned in corresponding locations in the base portion (i.e., near the edges of the base portion). Accordingly, the limited available positions for the magnets in the display housing correspond to limited available positions for the magnetic field sensors in the base portion. As a result, electrical connections (such as flexible circuits) to the magnetic field sensors are either limited or are not present. In the latter case, additional electrical connections must be routed to the magnetic field sensors, which can requires additional design specification changes and may increase production costs. Also, portable electronic devices that include audio modules subsequently include one or more magnets, including permanent magnets. A magnetic field from an audio module magnet can initiate false triggers by a traditional magnetic field sensor if the magnetic field from the audio module magnet is incident on the traditional magnetic field sensor, resulting in an unwanted signal and subsequent deactivation of the display assembly.

Fortunately, portable electronic devices described herein address these challenges. For example, a magnetic field sensor can be connected to an existing flexible circuit in use by another operational component in the portable electronic device, such as a microphone. Accordingly, the magnetic field sensor can rely upon an existing electrical layout in the portable electronic device. In another example, a magnetic field sensor can be placed within an audio assembly. As a result, the magnetic field sensor can rely upon not only the existing space dedicated to the audio assembly, but also exiting electrical connections present within the audio assembly.

Magnetic field sensors described herein may include anisotropic magneto-resistive sensors. In this regard, magnetic field sensors include a solid-state, magnetically sensitive element that detect and measure magnetic fields. These magnetic field sensors generate internal electrical resistance in the magnetically sensitive element when an electrical current is supplied, and the value of the electrical resistance changes under the influence of an externally-applied magnetic field. Further, the electrical resistance value is dependent upon the location of the externally-applied magnetic field incident on the magnetic field sensor. Accordingly, the orientation of the magnet, and in particular, the associated direction of the magnetic field of the magnet, relative to the magnetic field sensor influences the electrical resistance value of the magnetic field sensor. For instance, a magnet oriented in a manner such that its externally-applied magnetic field is incident on one location of the magnetic field sensor can cause the electrical resistance of the magnetic field sensor to increase to a value that is at or above a threshold electrical resistance value, thereby causing the magnetic field sensor to provide a signal indicating the magnetic field is detected. On the other hand, a magnet, when oriented in a different manner such that its externally-applied magnetic field is incident on a different location of the magnetic field sensor, causes little or no change in the electrical resistance value of the magnetic field sensor. As a result, the electrical resistance value remains below the threshold electrical resistance value, and the magnetic field sensor initiates no signal. Portable electronic devices described herein can use this feature of magnetic field sensors to selectively detect a desired magnetic field and ignore other magnetic fields.

Audio assemblies may be integrated into the base portion of a portable electronic device. When a magnetic field sensor is integrated into an audio assembly, the magnetic field sensor can be exposed to a magnetic field from the audio module magnet. However, the respective orientations of the magnets are such that a magnetic field from a display housing magnet is incident on the magnetic field sensor and detected by the magnetic field sensor, while a magnetic field from the audio module magnet is also incident on the magnetic field sensor but is not detected, or ignored, by the magnetic field sensor. Accordingly, the orientation between i) the display housing magnet and the magnetic field sensor, and ii) the audio module magnet and the magnetic field sensor can achieve this desired result.

Magnetic field sensors described herein may include a magnetically sensitive surface. A "magnetically sensitive surface" of a magnetic field sensor refers to a surface or plane in which a magnetic field incident on a magnetically sensitive element, or magnetically sensitive film, that causes a change in electrical resistance value of the magnetically sensitive element that is at or above the threshold electrical resistance value. Further, the angle of incidence (of the magnetic field) may be limited to a particular angle of incidence on the magnetically sensitive surface. In contrast to the aforementioned angle of incidence, a magnetic field incident on the magnetically sensitive surface of the magnetic field sensor at a different angle of incidence causes little or no change in the electrical resistance value of the magnetically sensitive element such that the value remains below the threshold electrical resistance value. By orienting magnets in different manners relative to the magnetic field sensor, their respective magnetic fields are oriented in different directions, and as a result, the respective magnetic fields are incident on the magnetically sensitive surface at different angles, or orientations, that are distinguishable by the magnetic field sensor.

Using magnetic field sensors that are relatively sensitive in specific locations provides several advantages. For example, the number of locations in which the magnetic field sensors can be positioned in a portable electronic device increases. As described above, a magnetic field sensor can be located in an audio assembly, thereby placing the magnetic field sensor in close proximity to an audio module magnet, while not affecting the desired functionality of the magnetic field sensor. The increased number of locations may result in fewer design/layout changes when integrating magnetic field sensors into portable electronic devices. Also, in some instances, a Hall Effect sensor rotated in-plane with a magnetic field may be used as well.

These and other embodiments are discussed below with reference to FIGS. 1-11. However, those skilled in the art will readily appreciate that the detailed description given herein with respect to these Figures is for explanatory purposes only and should not be construed as limiting.

FIG. 1 illustrates an isometric view of an embodiment of an electronic device 100 in an open position, in accordance with some described embodiments. The electronic device 100 may be referred to as a portable electronic device, which includes a laptop computing device, or simply a laptop. As shown, the electronic device 100 may include an enclosure 102, or housing. The enclosure 102 may include metals, such as aluminum, aluminum alloy or another metal that generally does not interfere with magnetic flux. Alternatively, the enclosure 102 may include rigid plastics.

The enclosure 102 may include a display housing 104, or lid, designed to carry a display assembly 106 that presents visual information in the form of motion images (video), still images (pictures), textual information, and software application programs. The enclosure 102 may further include a base portion 108 that is connected to the display housing 104. In particular, the base portion 108 is connected to the display housing 104 by one or more hinge assemblies (not shown in FIG. 1), thereby allowing rotation of the display housing 104 with respect to the base portion 108, or vice versa. Although not shown, circuit boards, processor circuits, memory circuits, batteries, audio modules, microphones, and flexible circuits (as non-limiting examples) may be positioned within a space or volume of the base portion 108.

The base portion 108 may include multiple features designed to provide an input that alters the visual information presented on the display assembly 106. For example, the base portion 108 may include a keyboard 112 and a touch pad 114. Also, the base portion 108 may include audio modules (not shown in FIG. 1) designed to generate acoustical energy in the form of audible sound. In order for the acoustical energy to exit the base portion 108, the base portion 108 may include openings 116a and openings 116b. Also, the electronic device 100 may include a port 110 used to receive power and/or receive and transmit data. As a non-limiting example, the port 110 may include a Universal Serial Bus ("USB") port, including a USB-C type port.

In the open position of the electronic device 100, the relative position (or spacing) between the display housing 104 and the base portion 108 allows a user to interact with the keyboard 112 and/or the touch pad 114, and view the display assembly 106. However, in the closed position, the display housing 104 is sufficiently rotated toward the base portion 108, the display assembly 106 is no longer viewable, and accordingly, may no longer provide use to the user. The electronic device 100 includes features designed to power down and deactivate the display assembly 106 in the closed position in order to conserve battery power. For example, the base portion 108 may include a magnetic field sensor 118a and a magnetic field sensor 118b designed to detect an external magnetic field from a magnet 122a and a magnet 122b, respectively, in the display housing 104 when the display housing 104 is rotated sufficiently close to the base portion 108. The magnet 122a and the magnet 122b may include a rare Earth element, such as neodymium. However, other magnetic materials are possible. As shown, both the magnet 122a and the magnet 122b are external to the display assembly 106. In other words, the display assembly 106 is positioned between the magnet 122a and the magnet 122a. When the magnetic field sensor 118a and the magnetic field sensor 118b detect an external magnetic field from the magnet 122a and the magnet 122b, respectively, the magnetic field sensor 118a and the magnetic field sensor 118b provide an input to a processor circuit (not shown in FIG. 1). The input is used as logic to indicate that the display housing 104 is in close proximity to the base portion 108, and the processor circuit initiates a command to deactivate the display assembly 106.

In some embodiments, the magnetic field sensor 118a and the magnetic field sensor 118b are Hall Effect sensors, tunneling magneto-resistance sensors, or giant magneto-resistance sensors. In the embodiment shown in FIG. 1, the magnetic field sensor 118a and the magnetic field sensor 118b are anisotropic magneto-resistive sensors. In this regard, the magnetic field sensor 118a and the magnetic field sensor 118b respond with a change in electrical resistance under the influence of a magnetic field. Further, the magnetic field sensor 118a and the magnetic field sensor 118b are sensitive to an external magnetic field incident on the magnetic field sensor 118a and the magnetic field sensor 118b in a particular direction, while being insensitive, and thus not detecting, an external magnetic field from a magnet in different directions. This allows the electronic device 100 to position the magnetic field sensor 118a and the magnetic field sensor 118b in close proximity to an audio module known to include one or more magnets, without the magnet (s) of the audio module triggering the magnetic field sensor (s). This will be shown and described further below.

Figure 2:
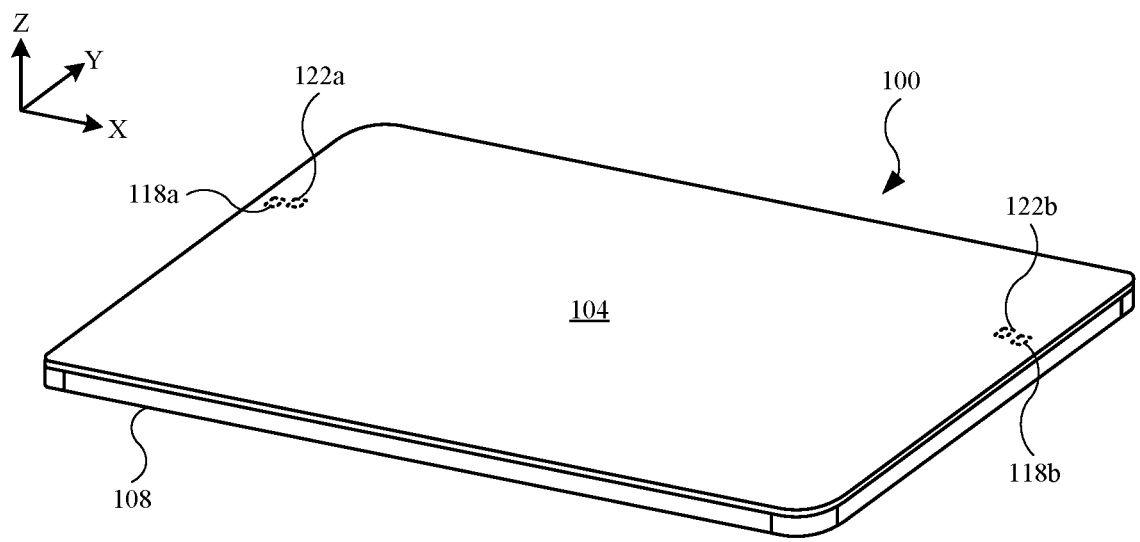
FIG. 2 illustrates an isometric view of the electronic device shown in FIG. 1, showing the electronic device in a closed position.

FIG. 2 illustrates an isometric view of the electronic device 100 shown in FIG. 1, showing the electronic device 100 in a closed position. As shown, the display housing 104 is positioned over and parallel, or at least substantially parallel, with respect to the base portion 108. The closed position represents a position in which the magnetic field sensor 118a and the magnetic field sensor 118b detect an external magnetic field from the magnet 122a and the magnet 122b, respectively, thereby causing each of the magnetic field sensor 118a and the magnetic field sensor 118b to provide a signal used to power down and deactivate the display assembly 106 (shown in FIG. 1). Although the display housing 104 is shown as being generally parallel with respect to the base portion 108, the display housing 104 can be positioned at some non-zero angle with respect to the base portion 108 such that the magnetic field sensor 118a and the magnetic field sensor 118b detect an external magnetic field from the magnet 122a and the magnet 122b, respectively. This will be shown below.

In the closed position of the electronic device 100, the magnet 122a and the magnet 122b are offset with respect to the magnetic field sensor 118a and the magnetic field sensor 118b, respectively. In other words, in the closed position, the magnet 122a and the magnet 122b are not aligned with the magnetic field sensor 118a and the magnetic field sensor 118b, respectively, along the Z-axis. Rather, the magnet 122a and the magnet 122b are offset with respect to the magnetic field sensor 118a and the magnetic field sensor 118b, respectively, along the X-axis. As a result, the external magnetic fields from the magnet 122a and the magnet 122b are incident along a magnetically sensitive surface of the magnetic field sensor 118a and the magnetic field sensor 118b, respectively, resulting in a change in the electrical resistant values of the magnetic field sensor 118a and the magnetic field sensor 118b above a threshold electrical resistance value. In some embodiments (not shown in FIG. 2), the magnet 122a and the magnet 122b are offset with respect to the magnetic field sensor 118a and the magnetic field sensor 118b, respectively, along the Y-axis or a combination of both the X- and Y-axes.

Figure 3:
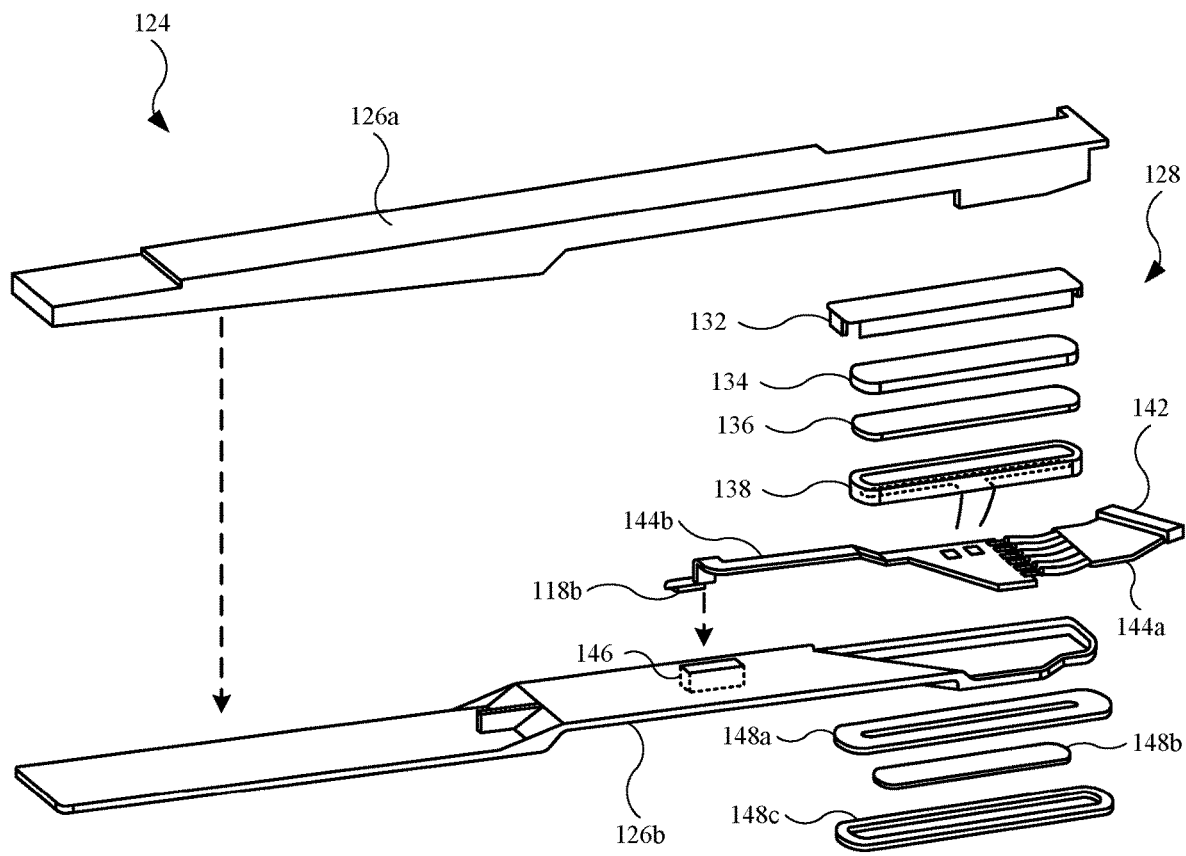
FIG. 3 illustrates an exploded view of an audio assembly for use in an electronic device, in accordance with some described embodiments.

FIG. 3 illustrates an exploded view of an audio assembly 124 for use in an electronic device, in accordance with some described embodiments. The electronic device may include the electronic device 100 (shown in FIG. 1). As shown, the audio assembly 124 may include a speaker housing component 126a and a speaker housing component 126b. The speaker housing component 126a can combine with the speaker housing component 126b to form an audio module housing for an audio module 128. Furthermore, the speaker housing component 126a and the speaker housing component 126b define a closed back volume in which the audio module 128 uses to drive air during operation. The "closed back volume" refers to an airtight back volume when the speaker housing component 126a is combined with the speaker housing component 126b, and integrated with other sealing elements (described below).

The audio module 128 includes components known to transduce electrical energy into acoustical energy. In this regard, the audio module 128 may include a diaphragm 132 that is acoustically driven to generate acoustical energy. The audio module 128 further includes a magnet 134, which may include a permanent magnet. The magnet 134 may be referred to as an audio module magnet. The audio module 128 further includes a plate 136, which may include metal (such as stainless steel), coupled with the magnet 134. The audio module 128 further includes a coil 138 that is coupled to the diaphragm 132 and at least partially surrounds the magnet 134. The coil 138 receives an oscillating electrical current that, in turn, forms an electromagnet with an oscillating polarity, causing the coil 138 to be magnetically attracted to and repelled by the magnet 134 in accordance with the oscillation. The oscillation drives the coil 138, and in turn drives the diaphragm 132, to produce acoustical energy in accordance with the frequency at which the diaphragm 132 is driven.

The audio assembly 124 further includes a magnetic field sensor, such as the magnetic field sensor 118b (also shown in FIG. 1), positioned within the audio module housing formed by the speaker housing component 126a and the speaker housing component 126b. As described above, the magnetic field sensor 118b is designed to detect a magnetic field in the display housing 104 (shown in FIG. 1) to assist in determining whether an electronic device 100 is an open or closed positioned (shown in FIGS. 1 and 2, respectively). When positioned in the audio module housing, at least some of the external magnetic field (not shown in FIG. 3) from the magnet 134 and/or the coil 138 (when forming an electromagnet) is incident on the magnetic field sensor 118b. However, the magnetic field sensor 118b can be oriented in the audio assembly 124 such that the magnetic field sensor 118b is not triggered by a magnetic field from the magnet 134 and the electromagnet formed by coil 138. However, the magnetic field sensor 118b can be oriented in the audio assembly 124 to detect the external magnetic field from the magnet 122b (shown in FIG. 1) located within the display housing 104, thereby triggering the magnetic field sensor 118b. In this regard, the magnetic field sensor 118b may be oriented in the audio assembly 124 to detect a magnetic field along a single axis (in an X-Y-Z Cartesian coordinate axis), and accordingly, the magnetic field sensor 118b may be referred to as a single-axis magnetic field sensor.

In order to receive electrical current, the audio module 128 (including the coil 138) requires an electrical connection to a power source (not shown in FIG. 3). In this manner, an electronic device (such as the electronic device 100, shown in FIG. 1) includes a flexible circuit 144a electrically coupling the power source to the audio module 128. The flexible circuit 144a is connected to a connector 142 that can be electrical coupled to a flexible circuit (not shown in FIG. 3) located in the electronic device. Also, in order to operate, the magnetic field sensor 118b also requires a power source. To provide power to the magnetic field sensor 118b, the flexible circuit 144a can be modified to provide an electrical connect to the magnetic field sensor 118b. For example, a flexible circuit 144b can be integrated into the audio assembly 124 and electrically coupled to the flexible circuit 144a, and accordingly, to the connector 142. The flexible circuit 144b can provide an electrical connection for the magnetic field sensor 118b, and in some instances, an electrical connection for the audio module 128. Accordingly, when the connector 142 is electrically coupled to a flexible circuit within an electronic device, the audio module 128 and the magnetic field sensor 118b are in electrical communication with circuitry within the electronic device.

The magnetic field sensor 118b may be positioned within a protruding feature 146 that is part of the speaker housing component 126b, with the protruding feature 146 forming part of the back volume. Once positioned in the protruding feature 146, the magnetic field sensor 118b may be potted with a potting material (not shown in FIG. 3) to provide a seal against ingress of air and other unwanted items. Also, when the electrical connections are made and the speaker housing component 126a is assembled with the speaker housing component 126b, the audio assembly 124 can be sealed. For example, a sealing element 148a, a sealing element 148b, and a sealing element 148c may be incorporated. At least some of the aforementioned sealing elements provide a seal along the connections between the connector 142, the flexible circuit 144a, and the flexible circuit 144b. Although not shown, in order to secure the audio assembly 124 in an electronic device, adhesives and/or fasteners (screws) may be used.

The integration of the magnetic field sensor 118b into the audio assembly 124 provides several advantages that may lead to fewer engineering and design changes, resulting in less overall cost. For example, a flexible circuit (not shown in FIG. 3) is already integrated into the electronic device and is routed from a circuit board (in the electronic device) to the connector 142 and the flexible circuit 144a. As a result, an additional, separate flexible circuit from the circuit board is not required for the magnetic field sensor 118b, as the flexible circuit 144b can be internally housed in the audio assembly 124 and electrically coupled to the flexible circuit 144a. Also, due to the integration of the magnetic field sensor 118b in the audio assembly 124, the electronic device does not require dedicated space for the magnetic field sensor 118b, as the audio assembly 124 is already located in the electronic device.

Figure 4:
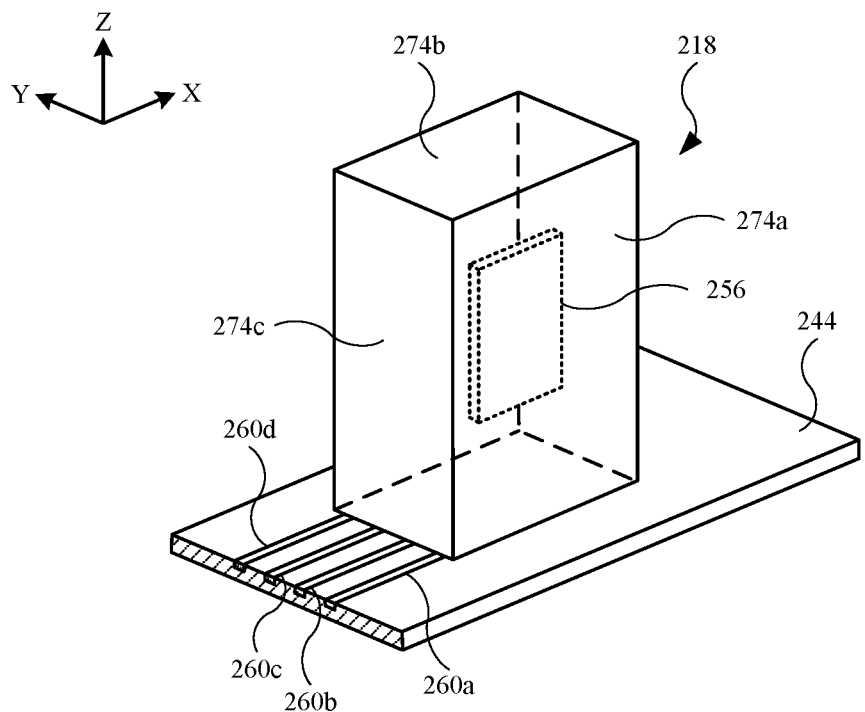
FIG. 4 illustrates an isometric view of an embodiment of a magnetic field sensor, in accordance with some described embodiments.

FIG. 4 illustrates an isometric view of an embodiment of a magnetic field sensor 218, in accordance with some described embodiments. The magnetic field sensor 218 may include any features previously described for a magnetic field sensor for use with an electronic device. For example, the magnetic field sensor 218 may include an anisotropic magneto-resistive sensor or a Hall Effect sensor, as non-limiting examples. Also, the magnetic field sensor 218 can be integrated into electronic devices described herein.

As shown, the magnetic field sensor 218 is electrically coupled to a flexible circuit 244. The flexible circuit 244 includes a positive wire 260a and a negative wire 260b used to relay power to the magnetic field sensor 218 from a power source (not shown in FIG. 4). The magnetic field sensor 218 includes a magnetically sensitive element 256. In some embodiments, the magnetically sensitive element 256 includes a permalloy film. When the magnetic field sensor 218 is powered, the magnetically sensitive element 256 includes an associated electrical resistance value. Further, the electrical resistance value changes when an externally-applied magnetic field is incident on the magnetically sensitive element 256 in a particular direction. The flexible circuit 244 further includes a ground wire 260c that provides a ground reference to the magnetic field sensor 218. The flexible circuit 244 further includes a signal wire 260d that is used by the magnetic field sensor 218 to send a signal to an electronic device when a magnetic field is detected. The detection of the magnetic field is based on a change in the electrical resistance value of the magnetically sensitive element 256. For instance, when the electrical resistance value increases above a threshold electrical resistance value, the magnetic field sensor 218 provides a signal using the signal wire 260d.

The magnetic field sensor 218 may provide an output, via the signal wire 260d, in the form of a switching current when the electrical resistance value (corresponding to the externally-applied magnetic field) reaches or exceeds a threshold electrical resistance value. In some embodiments, for a range of values of an externally-applied magnetic field, the magnetic field sensor 218 responds to the magnetic field with a corresponding linear change in electrical resistance values. In this regard, the magnetic field sensor 218 may use the signal wire 260d to provide an analog electrical current proportional to the electrical resistance value.

As shown, the magnetic field sensor 218 includes multiple surfaces. For example, the magnetic field sensor 218 includes a surface 274a, a surface 274b, and a surface 274c. The surface 274a is parallel, or approximately, parallel to a major surface of the magnetically sensitive element 256. The magnetic field sensor 218 is designed to respond to an externally-applied magnetic field with a change in electrical resistance when the magnetic field is incident on the magnetically sensitive element 256 at a particular angle or a particular set of angles (with respect to the magnetically sensitive element 256). The particular angle may include some angle approximately in the range of 30 to 80 degrees, as a non-limiting example. However, in some instances, the particular angle may be a normal, or perpendicular, angle or some other predefined set of angles. However, the magnetic field sensor 218 is not sensitive to an externally-applied magnetic field and does not respond with a change in electrical resistance when the magnetic field is incident on the magnetic field sensor 218 at some angle other than the particular angle(s). Based on its position relative to the magnetically sensitive element 256, the surface 274a (along the Y-Z plane) defines a magnetically sensitive surface of the magnetic field sensor 218. When a magnetic field (not shown in FIG. 4) is incident on the surface 274a at the particular angle or predefined angle(s), the magnetically sensitive element 256 responds with a change in electrical resistance, and the magnetic field sensor 218 subsequently initiates a signal indicating the magnetic field is detected. However, when a magnetic field is incident on the surface 274a at some other angle, a change in electrical resistance in the magnetically sensitive element 256 is relatively minimal, and the magnetic field sensor 218 does not initiate a signal. Also, when the magnetic field is incident on the surface 274b (along the X-Y plane) and/or the surface 274c (along the X-Z plane), each of which define a magnetically insensitive surface, a change in electrical resistance in the magnetically sensitive element 256 is relatively minimal, and the magnetic field sensor 218 does not initiate a signal. Although not labeled, the remaining surfaces of the magnetic field sensor 218 may also define magnetically insensitive surfaces.

Figure 5:
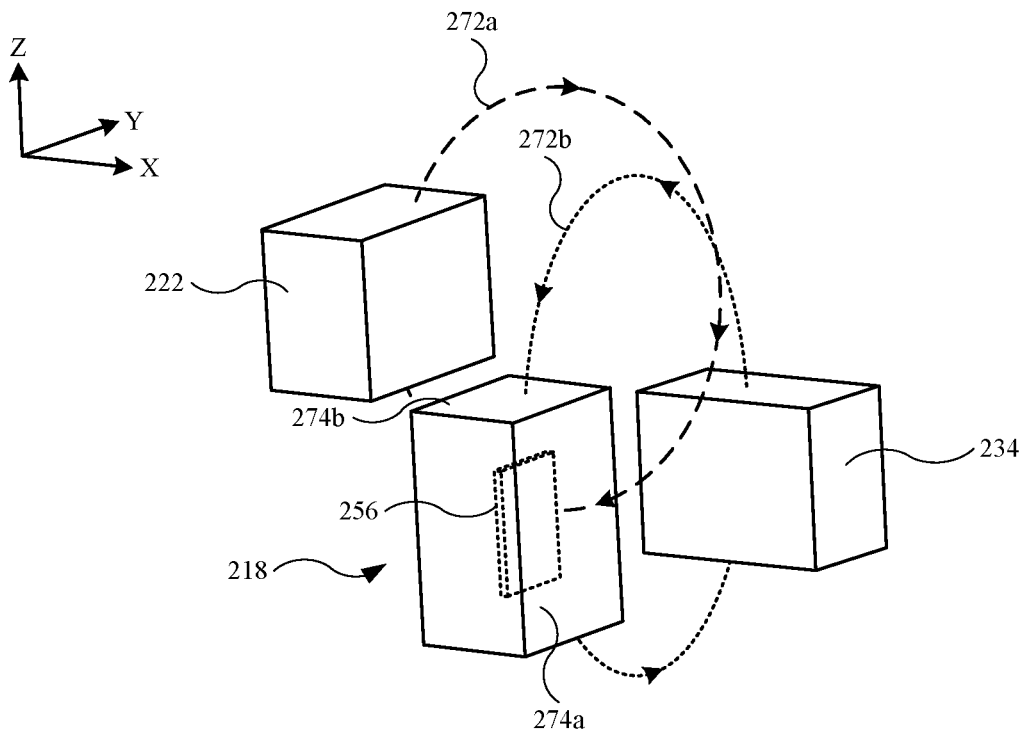
FIG. 5 illustrates an isometric view of the magnetic field sensor shown in FIG. 4, further showing magnets emitting external magnetic fields incident on the magnetic field sensor.

FIG. 5 illustrates an isometric view of the magnetic field sensor 218 shown in FIG. 4, further showing a magnet 222 and a magnet 234 emitting external magnetic fields incident on the magnetic field sensor 218. For purposes of simplicity, the flexible circuit 244 (shown in FIG. 4) is removed. The magnetic field sensor 218 is oriented with respect to the magnet 222 such that an external magnetic field 272a from the magnet 222 is incident on the surface 274a, and in particular, incident on the magnetically sensitive element 256. As a result, the electrical resistance value of the magnetically sensitive element 256 substantially changes (or increases above the threshold electrical resistance value), corresponding to a detection of the external magnetic field 272a by the magnetic field sensor 218. In order to achieve this orientation, the magnet 222 is offset with respect to the magnetic field sensor 218. In other words, the magnet 222 is not directly over the magnetic field sensor 218, i.e., the magnet 222 is not aligned with the magnetic field sensor 218 along the Z-axis, and is offset along the X-axis. In some instances, the offset distance along the X-axis is in the range of 1-5 millimeters. Conversely, the magnetic field sensor 218 is oriented with respect to the magnet 234 such that an external magnetic field 272b from the magnet 234 is incident on the surface 274b. As a result, the electrical resistance value of the magnetically sensitive element 256 does not significantly change, and the magnetic field sensor 218 does not detect the external magnetic field 272b. Accordingly, the magnetic field sensor 218 effectively ignores the magnet 234, despite the external magnetic field 272b being incident on the surface 274b. Although the magnetic field sensor 218 is offset with respect to the magnet 234 along the Y-axis, other offset positions and orientations may be used to achieve the desired effect. FIG. 5 shows that while multiple external magnetic fields from different magnets are incident on the magnetic field sensor 218, the magnetic field sensor 218 can nonetheless distinguish between the multiple external magnetic fields and initiate a signal output, corresponding to a magnetic field detection, only when an external magnetic field from a particular magnet is detected.

When implemented in an electronic device, the magnet 234 and the magnetic field sensor 218 can be installed in a base portion, such as the base portion 108 (shown in FIG. 1). The magnet 234 can be part of an audio module (such as the audio module 128, shown in FIG. 3). In some instances, the magnetic field sensor 218 is integrated within an audio assembly that includes the audio module, and the magnetic field sensor 218 is oriented with respect to the magnet 234 in a manner similar to what is shown in FIG. 5. Further, when implemented in an electronic device, the magnet 222 is secured to a display housing, such as the display housing 104 (shown in FIG. 1). When the display housing is sufficiently close to the base portion, the external magnetic field 272a is incident on the surface 274a, as shown in FIG. 5, and the magnetic field sensor 218 detects the external magnetic field 272a and provides an input signal used to deactivate a display assembly, such as the display assembly 106 (shown in FIG. 1). Regardless of the position of the magnet 222, the magnet 234 has no effect on the magnetic field sensor 218, and the magnetic field sensor 218 does not respond with a change in electrical resistance due to the external magnetic field 272b from the magnet 234.

Figure 6:
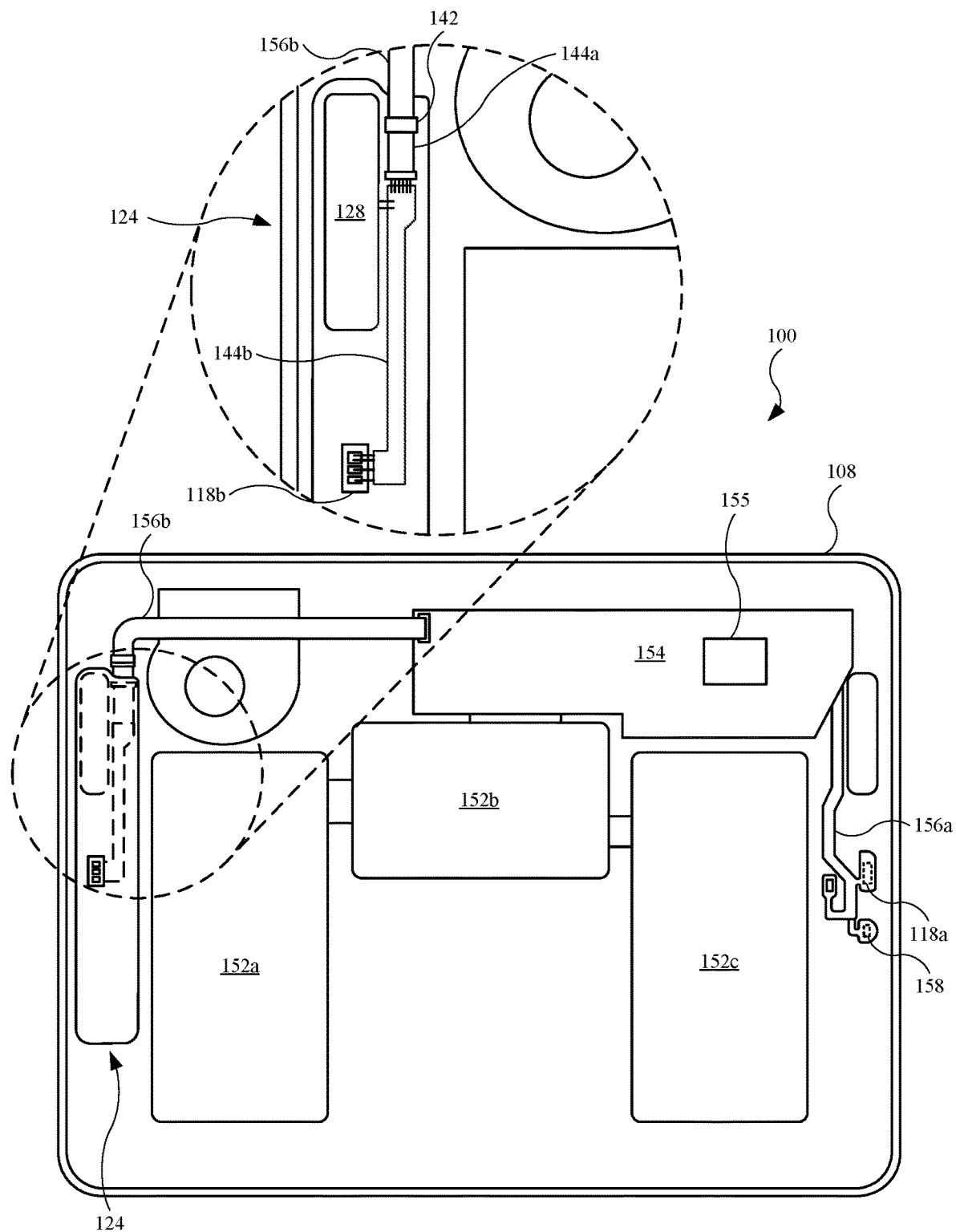
FIG. 6 illustrates a plan view of the electronic device, showing an internal layout of several components in the base portion.

FIG. 6 illustrates a plan view of the electronic device 100, showing an internal layout of several components in the base portion 108. For purposes of illustration, a housing part of the base portion 108 is removed. Also, for purposes of simplicity, several components are removed from the base portion 108. As shown, the base portion 108 includes a battery module 152a, a battery module 152b, and a battery module 152c. The base portion 108 further includes a circuit board 154 that is electrically coupled to the battery module 152a, the battery module 152b, and the battery module 152c. The circuit board 154 includes a processor circuit 155. Although not shown, the circuit board 154 may include several processor circuits, such as a central processing unit and a graphics processing unit.

The base portion 108 further includes a flexible circuit 156a electrically coupled to the circuit board 154, with the flexible circuit 156a carrying a microphone 158 designed to receive and transduce acoustic energy generated externally to the electronic device 100. Also, the flexible circuit 156a may carry the magnetic field sensor 118a (also shown in FIG. 1), and accordingly, can route power (from the aforementioned battery modules) to the microphone 158 and the magnetic field sensor 118a. The flexible circuit 156a can further carry signals generated by the magnetic field sensor 118a. In this manner, an additional, separate flexible circuit is not required, as the magnetic field sensor 118a is in communication with the circuit board 154 via the flexible circuit 156a.

The base portion 108 further includes a flexible circuit 156b that is routed to the audio assembly 124. As shown in the enlarged view, the flexible circuit 156b electrically couples with the connector 142. The flexible circuit 156b can route power (from the aforementioned battery modules) to the audio module 128 and the magnetic field sensor 118b via the flexible circuit 144a and the flexible circuit 144b. The flexible circuit 156b can further carry signals generated by the magnetic field sensor 118b. Although not shown, an audio assembly may be positioned proximate to the flexible circuit 156a such that the electronic device 100 includes at least two audio assemblies.

When the electronic device 100 is in the closed positioned (as shown in FIG. 2), or is at least substantially closed, both the magnetic field sensor 118a and the magnetic field sensor 118b detect a respective magnetic field and provide a signal to the circuit board 154. The processor circuit 155 can use both signals to determine that the electronic device 100 is closed. Accordingly, the signals generated by the magnetic field sensor 118a and the magnetic field sensor 118b provide redundancy that the electronic device 100 is closed, or at least substantially closed, and false triggering due to a signal provided by only one of the magnetic field sensor 118a or the magnetic field sensor 118b is avoided.

FIGS. 7-9 show the relative positions between the magnetic field sensor 118a and the magnetic field sensor 118b in the electronic device 100. FIG. 7 illustrates a plan view of the electronic device 100, showing the position of the magnetic field sensors in the base portion 108. As shown, the magnetic field sensor 118b is elevated along the Y-axis relative to the magnetic field sensor 118a. This may be due to design constraints and/or to position the magnetic field sensors in a desired location (that is, to detect magnet fields from magnets in the display housing 104, shown in FIG. 1).

FIG. 8 illustrates a cross sectional view of the electronic device 100 shown in FIG. 7, taken along line 8-8. As shown, the base portion 108 includes a housing part 162a and a housing part 162b coupled to the housing part 162a. The flexible circuit 156a, which carries the magnetic field sensor 118a, is coupled to the housing part 162b by an adhesive (not shown in FIG. 8).

FIG. 9 illustrates a cross sectional view of the electronic device 100 shown in FIG. 7, taken along line 9-9. The audio assembly 124, which carries the magnetic field sensor 118b, is coupled to the housing part 162a. Also, the speaker housing component 126b includes a through hole 164 to allow access to the magnetic field sensor 118b. Also, a potting material 166 fills the audio assembly 124 and surrounds the magnetic field sensor 118b. The potting material 166 can protect the magnetic field sensor 118b and provide an airtight seal for the audio assembly 124.

Referring to both FIGS. 8 and 9, the magnetic field sensor 118b is elevated along the Z-axis, as compared to the magnetic field sensor 118a. Also, the magnetic field sensor 118a is facing the housing part 162a, while the magnetic field sensor 118b is facing the housing part 162b. This may be due to design considerations, including electrical considerations. Although not shown, other configurations and orientations are possible.

Figure 10:
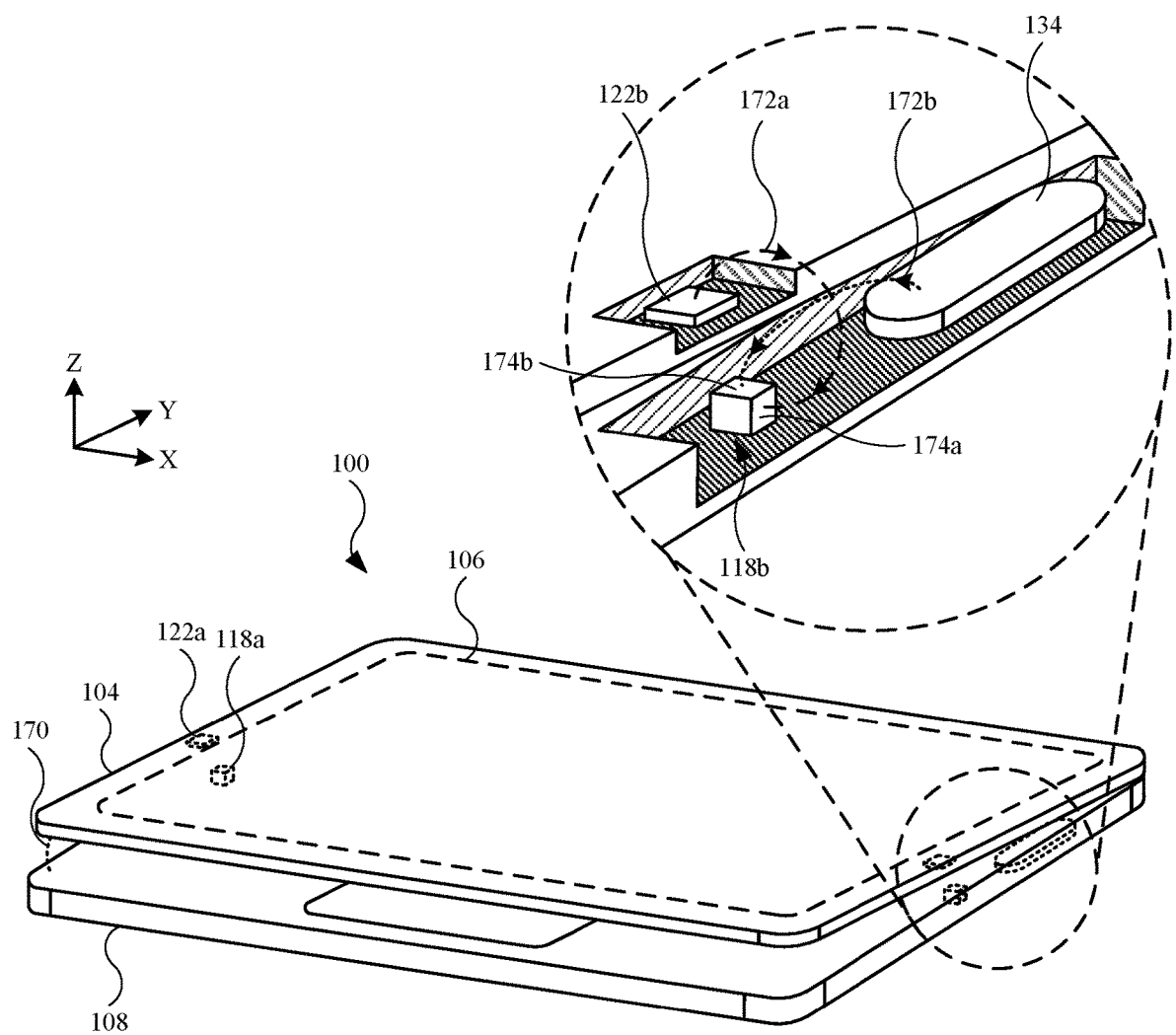
FIG. 10 illustrates an isometric view of the electronic device, showing a magnetic field sensor and multiple magnetic fields incident on the magnetic field sensor.

FIG. 10 illustrates an isometric view of the electronic device 100, showing the magnetic field sensor 118b and multiple magnetic fields incident on the magnetic field sensor 118b. As shown, the display housing 104 is positioned at an angle 170 relative to the base portion 108. The angle 170 may be approximately in the range of 0 to 10 degrees. In some embodiments, the angle 170 is 2 degrees.

The angle 170 between the display housing 104 and the base portion 108 is such that an external magnet field from the magnet 122a and the magnet 122b is incident on the magnetic field sensor 118b and the magnetic field sensor 118b, respectively. For example, as shown in the enlarged view, an external magnetic field 172a from the magnet 122b in the display housing 104 is incident on a surface 174a of the magnetic field sensor 118b. The surface 174a defines a magnetically sensitive surface of the magnetic field sensor 118b such that a magnetic field incident on surface 174a is also incident a magnetically sensitive element (not shown in FIG. 10). Further, when the magnetic field is incident on the surface 174a at a particular angle or some predefine set of angles, the electrical resistance value of the magnetically sensitive element changes such that the magnetic field sensor 118b is triggered. Also, an external magnetic field 172b from the magnet 134 associated with an audio module (such as the audio module 128, shown in FIG. 6) is incident on a surface 174b of the magnetic field sensor 118b. However, a magnetic field from the magnet 134 that is incident on the surface 174b will not alter the electrical resistance value of the magnetic sensitive element to trigger the magnetic field sensor 118b. Accordingly, the orientation of the magnet 122b and the magnet 134 within the electronic device 100 results in detection, by the magnetic field sensor 118b, of the magnetic field generated only by the magnet 122b. Further, the orientation of the magnetic field sensor 118b relative to the magnet 134 allows both the magnetic field sensor 118b and the magnet 134 to be contained within an audio assembly (such as the audio assembly 124, shown in FIG. 3), as the magnetic field sensor 118b is not affected by the magnetic field from the magnet 134. Further, it should be noted that in instances when an external magnetic field from the magnet 134 is incident on the surface 174a at some angle other than the particular or predefined angle(s), the magnetic field sensor 118b will nonetheless not alter the electrical resistance value of the magnetic sensitive element to trigger the magnetic field sensor 118b. Accordingly, the magnetic field sensor 118b can be oriented relative to the magnet 134 (or vice versa) such that any magnetic field generated by the magnet 134 will not trigger the magnetic field sensor 118b.

It should be noted that the magnetic field sensor 118a may function in a similar manner to that of the magnetic field sensor 118b when an external magnetic field from the magnet 122a is incident on a magnetically sensitive surface of the magnetic field sensor 118a. As a result, the magnetic field sensor 118a can detect an external magnetic field incident on one surface and effectively ignore an external magnetic field incident on another surface (or surfaces). Also, in some instances, the electronic device 100 is configured such that a signal from both the magnetic field sensor 118a and the magnetic field sensor 118b is required in order to power down and deactivate the display assembly 106.

Also, while the angle 170 represents a deactivation angle, or angle at which the display assembly 106 powers down automatically without a direct user input, it is further desirable, generally, that the electronic device 100 also automatically activate the display assembly 106. For example, when the display housing 104 is rotated away from the base portion 108 and the angle between the display housing 104 and the base portion 108 is greater than the angle 170, the external magnetic field from the magnet 122a and the magnet 122a are no longer incident on the magnetic field sensor 118a and the magnetic field sensor 118b, respectively. As a result, each of the magnetic field sensor 118a and the magnetic field sensor 118b may cease providing a signal to the processor circuit (not shown in FIG. 10), and the processor circuit subsequently provides a command to activate the display assembly 106. This angle between the display housing 104 and the base portion 108 may be referred to as an activation angle.

Also, it may be desirable to integrate a hysteresis gap, which represents a switching gap (i.e., magnetic field sensors switching on and off) between the activation angle and the deactivation angle such that the activation angle is different from the deactivation angle. When then angle 170, or deactivation angle, is 2 degrees and the angle between the display housing 104 and the base portion 108 is at or less than 2 degrees, the display assembly 106 is deactivated in a manner described above. In order to activate the display assembly 106, the display housing 104 must be rotated away from the base portion 108 such that angle between the display housing 104 and the base portion 108 is greater than the deactivation angle of 2 degrees. In this regard, the activation angle can be 4 degrees, as a non-limiting exemplary angle. This prevents the display assembly 106 from repeatedly turning off and on when the display housing 104 is at the angle 170 relative to the base portion 108. It should be noted that if the angle 170 is greater than 2 degrees, a corresponding increase in the activation angle required to activate the display assembly 106 should be used to ensure a hysteresis gap.

Although a number of magnetic field sensors are shown in the electronic device 100, the number of magnetic field sensors can vary. For instance, the electronic device 100 may include a single magnetic field sensor. Also, the microphone 158 and the audio assembly 124 (shown in FIG. 6) can be positioned in different locations of the base portion 108, and as a result, the magnetic field sensor 118a and the magnetic field sensor 118b can also be in different locations in accordance with the location of the microphone 158 and the audio assembly 124, respectively. The magnetic field sensor 118a and the magnetic field sensor 118b can also be in different locations in accordance with the location of the magnet 122a and the magnet 122a, respectively. Also, in some embodiments (not shown), the magnet 122a and the magnet 122a are located in the base portion 108, and the magnetic field sensor 118a and the magnetic field sensor 118b are located in the display housing 104. In some embodiments (not shown), one of the magnet 122a and the magnet 122a is located in the display housing 104, while the remaining magnet is located in the base portion 108, and one of the magnetic field sensor 118a and the magnetic field sensor 118b is located in the display housing 104, while the remaining magnetic field sensor is located in the base portion 108.

Figure 11:
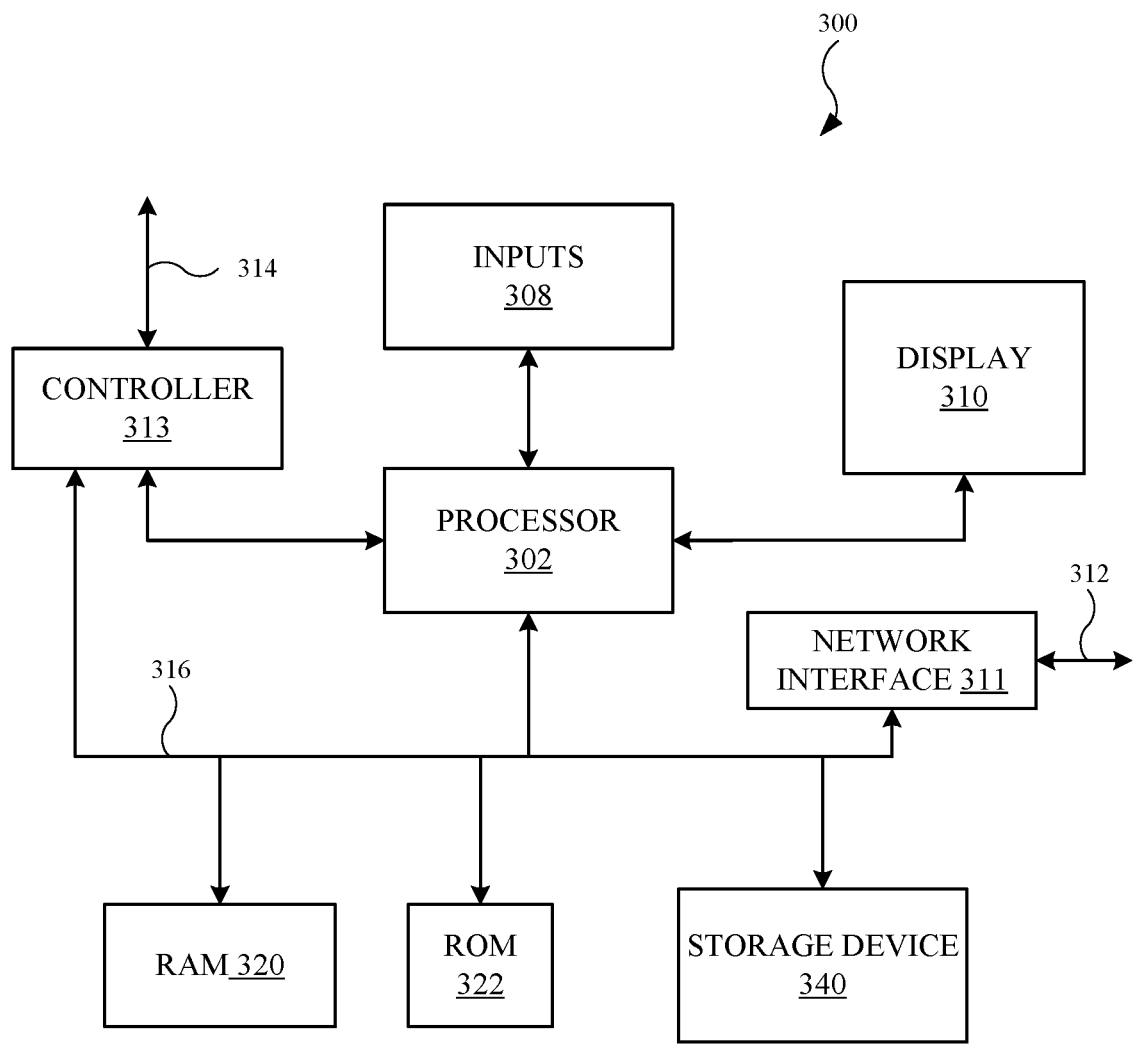
FIG. 11 illustrates a block diagram of an electronic device, in accordance with some described embodiments.

FIG. 11 illustrates a block diagram of an electronic device 300, in accordance with some described embodiments. The components shown for the electronic device 300 in the block diagram may be incorporated into the electronic device 100 (shown in FIG. 1). The electronic device 300 can include a processor 302 that represents a microprocessor or controller for controlling the overall operation of electronic device 300. The electronic device 300 can also include inputs 308. Some of the inputs 308 allow a user of the electronic device 300 to interact with the electronic device 300. For example, the inputs 308 can take the form of a variety of user input devices, such as a button, a keypad, a dial, touch screen, audio input interface, visual/image capture input interface, input in the form of sensor data, etc. The inputs 308 may include magnetic field sensors, such as Hall Effect sensors or anisotropic magneto-resistive sensors, that provide an input (in the form of an electrical signal) to determine whether a display 310 of the electronic device 300 should be activated or deactivated.

The display 310 (screen display) that can be controlled by the processor 302 to present visual information to the user. The electronic device 300 may further include a controller 313 that can be used to interface with and control different equipment through an equipment control bus 314. A data bus 316 can facilitate data transfer between at least the processor 302, a controller 313, and a storage device 340. The electronic device 300 can also include a network/bus interface 311 that couples to a data link 312. In the case of a wireless connection, the network/bus interface 311 can include a wireless transceiver.

The storage device 340 may include a single disk or multiple disks (e.g., hard drives), as well as a storage management module that manages one or more partitions within the storage device 340. In some embodiments, the storage device 340 can include flash memory, semiconductor (solid state) memory or the like. The electronic device 300 can also include a Random Access Memory 320, or RAM, and a Read-Only Memory 322, or ROM. The Random Access Memory 320 can provide volatile data storage, and stores instructions related to the operation of the electronic device 300. The Read-Only Memory 322 can store programs, utilities or processes to be executed in a non-volatile manner.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A portable electronic device, comprising:
a display housing that carries a first magnet that emits a first external magnetic field in accordance with a first orientation;
a base portion rotationally coupled to the display housing, the base portion comprising a second magnet that emits a second external magnetic field in accordance with a second orientation different from the first orientation;
an audio assembly located in the base portion; and
a magnetic field sensor disposed in the audio assembly, wherein when the first external magnetic field and the second external magnetic field are incident on the magnetic field sensor, the magnetic field sensor is capable of distinguishing the first external magnetic field from the second external magnetic field.

2. The portable electronic device of claim 1, wherein the display housing further carries a display, and wherein the magnetic field sensor provides a signal, when the first external magnetic field is detected, that deactivates the display.

3. The portable electronic device of claim 2, wherein the magnetic field sensor is configured to detect only the first external magnetic field and ignore the second external magnetic field.

4. The portable electronic device of claim 1, wherein:
the magnetic field sensor comprises a magnetically sensitive surface; and
the first orientation causes the first external magnetic field to be incident on the magnetically sensitive surface in a first direction; and
the second orientation causes the first external magnetic field to be incident on the magnetically sensitive surface in a second direction different from the first direction.

5. The portable electronic device of claim 1, wherein the first external magnetic field is detected when the display housing is rotated toward the base portion such that the magnetic field sensor is exposed to the first external magnetic field.

6. A portable electronic device, comprising:
a display housing that carries a display assembly, the display housing further carrying a magnet that emits an external magnetic field; and
a base portion rotationally coupled to the display housing, the base portion comprising an audio assembly that includes:
an audio module housing;
an audio module located in the audio module housing and capable of generating acoustical energy; and
a magnetic field sensor located in the audio module housing and configured to detect the external magnetic field and provide a signal, when the external magnetic field is detected, that is used to deactivate the display assembly.

7. The portable electronic device of claim 6, wherein the magnetic field sensor detects the external magnetic field when the display housing is rotated toward the base portion such that the external magnetic field is incident on a surface of the magnetic field sensor.

8. The portable electronic device of claim 6, wherein the magnetic field sensor comprises an anisotropic magneto-resistive sensor.

9. The portable electronic device of claim 6, wherein the audio module comprises an audio module magnet that generates an external magnetic field, and wherein the magnetic field sensor does not provide the signal based on the external magnetic field of the audio module magnet.

10. The portable electronic device of claim 9, wherein:
the magnet is incident on the magnetic field sensor and generates a first electrical resistance value that is greater than a threshold electrical resistance value that is required for the magnetic field sensor to initiate the signal, and
the audio module magnet is incident the magnetic field sensor and generates a second electrical resistance value that is less than the threshold electrical resistance value.

11. The portable electronic device of claim 6, wherein the audio module housing comprises a back volume and a through hole that opens to the back volume, and wherein the magnetic field sensor is positioned in the back volume and uncovered by the audio module housing based on the through hole.

12. A portable electronic device, comprising:
a display housing that carries a display, the display housing further carrying a first magnet that emits a first external magnetic field, the display housing carrying a second magnet that emits a second external magnetic field, wherein the display is positioned between the first magnet and the second magnet; and
a base portion rotationally coupled to the display housing, the base portion comprising:
an audio assembly;
a flexible circuit electrically coupled to the audio assembly;
a first magnetic field sensor configured to detect the first external magnetic field, the first magnetic field sensor located within the audio assembly; and
a second magnetic field sensor configured to detect the second external magnetic field, the second magnetic field sensor located on the flexible circuit.

13. The portable electronic device of claim 12, further comprising:
a circuit board located in the base portion; and
a second flexible circuit electrically coupled to the audio assembly and the first magnetic field sensor.

14. The portable electronic device of claim 12, wherein the audio assembly comprises an audio module housing that defines a back volume, and wherein the first magnetic field sensor is located in the back volume.

15. The portable electronic device of claim 12, wherein the first magnetic field sensor comprises a first anisotropic magneto-resistive sensor, and wherein the second magnetic field sensor comprises a second anisotropic magneto-resistive sensor.

16. The portable electronic device of claim 12, wherein the first magnetic field sensor comprises a first single-axis magnetic field sensor, and wherein the second magnetic field sensor comprises a second single-axis magnetic field sensor.

17. The portable electronic device of claim 12, wherein:
the display is deactivated when the first magnetic field sensor detects the first external magnetic field; and
the display is deactivated when the second magnetic field sensor detects the second external magnetic field.

18. The portable electronic device of claim 12, wherein the audio assembly comprises an audio module magnet that generates an audio module magnet external magnetic field, and wherein the first magnetic field sensor detects only the first external magnetic field.

19. The portable electronic device of claim 12, wherein:
the base portion comprising a first housing part and a second housing part coupled to the first housing part;
the first magnetic field sensor is coupled with the first housing part; and
the second magnetic field sensor is coupled with the second housing part.

\* \* \* \* \*